United States Patent
Kim et al.

(10) Patent No.: US 9,496,510 B2
(45) Date of Patent: Nov. 15, 2016

(54) FLEXIBLE SUBSTRATE, METHOD OF MANUFACTURING THE SAME, AND ORGANIC LIGHT EMITTING DIODE DISPLAY

(71) Applicant: SAMSUNG DISPLAY CO., LTD., Yongin (KR)

(72) Inventors: Yong-Jin Kim, Yongin (KR); Sang-Hyun Jun, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/025,854

(22) Filed: Sep. 13, 2013

(65) Prior Publication Data

US 2014/0306194 A1    Oct. 16, 2014

(30) Foreign Application Priority Data

Apr. 12, 2013    (KR) .................. 10-2013-0040651

(51) Int. Cl.
| | | |
|---|---|---|
| *H01L 29/08* | (2006.01) | |
| *H01L 35/24* | (2006.01) | |
| *H01L 51/00* | (2006.01) | |
| *H01L 27/32* | (2006.01) | |
| *H01L 21/02* | (2006.01) | |

(52) U.S. Cl.
CPC ..... *H01L 51/0097* (2013.01); *H01L 21/02381* (2013.01); *H01L 21/02595* (2013.01); *H01L 21/02675* (2013.01); *H01L 27/3244* (2013.01); *H01L 2251/5338* (2013.01); *Y02E 10/549* (2013.01); *Y02P 70/521* (2015.11); *Y10T 428/24612* (2015.01)

(58) Field of Classification Search
CPC ........... H01L 51/0097; H01L 27/3244; H01L 21/02675; H01L 21/02381; H01L 21/02595
USPC .............................. 257/40; 438/487; 428/172
See application file for complete search history.

(56) References Cited

U.S. PATENT DOCUMENTS

| | | | |
|---|---|---|---|
| 7,022,591 B2 * | 4/2006 | Chang ...................... | 438/482 |
| 2006/0131585 A1 | 6/2006 | Kim et al. | |
| 2006/0146033 A1 * | 7/2006 | Chen et al. ................. | 345/173 |
| 2013/0062659 A1 | 3/2013 | Lee et al. | |

FOREIGN PATENT DOCUMENTS

| | | |
|---|---|---|
| EP | 0-612-102 A2 | 8/1994 |
| EP | 1-758-155 A1 | 2/2007 |
| JP | 05-320371 A | 12/1993 |
| KR | 10-1999-0045170 A | 6/1999 |
| KR | 10-2011-0109560 A | 10/2011 |
| WO | WO 2005/050754 A1 | 6/2005 |

OTHER PUBLICATIONS

European Search Report mailed Sep. 22, 2014 in corresponding European Patent Application No. 14152182.3.

* cited by examiner

*Primary Examiner* — Stephen W Smoot
*Assistant Examiner* — Vicki B Booker
(74) *Attorney, Agent, or Firm* — Lee & Morse, P.C.

(57) ABSTRACT

A flexible substrate, a method of manufacturing the same, and an organic light emitting diode display, the flexible substrate including a first flexible layer; a polysilicon layer on the first flexible layer, the polysilicon layer having a plurality of protrusions on a surface thereof; and a second flexible layer on the polysilicon layer.

12 Claims, 12 Drawing Sheets

FLEXIBLE SUBSTRATE, METHOD OF MANUFACTURING THE SAME, AND ORGANIC LIGHT EMITTING DIODE DISPLAY

CROSS-REFERENCE TO RELATED APPLICATION

Korean Patent Application No. 10-2013-0040651, filed on Apr. 12, 2013, in the Korean Intellectual Property Office, and entitled: "Flexible Substrate, Method of Manufacturing the Same, and Organic Light Emitting Diode Display," is incorporated by reference herein in its entirety.

BACKGROUND

1. Field

Embodiments relate to a flexible substrate, a method of manufacturing the same, and an organic light emitting diode display.

2. Description of the Related Art

An organic light emitting diode display is a self-light emitting display device that displays an image using an organic light emitting diode emitting light. The organic light emitting diode display does not require a separate light source, unlike a liquid crystal display. Thus, a thickness and a weight of the organic light emitting diode display may be significantly reduced. Further, the organic light emitting diode display may have high quality characteristics such as low power consumption, high luminance, and high reaction speed. Thus, the organic light emitting diode display may be a next generation display device of a portable electronic device.

The above information disclosed in this Background section is only for enhancement of understanding of the background of the invention and therefore it may contain information that does not form the prior art that is already known in this country to a person of ordinary skill in the art.

SUMMARY

Embodiments are directed to a flexible substrate, a method of manufacturing the same, and an organic light emitting diode display.

The embodiments may be realized by providing a flexible substrate including a first flexible layer; a polysilicon layer on the first flexible layer, the polysilicon layer having a plurality of protrusions on a surface thereof; and a second flexible layer on the polysilicon layer.

The protrusions may be irregularly disposed on the polysilicon layer.

The plurality of protrusions may be regularly arranged.

The plurality of protrusions may have a linear shape or a polygonal shape.

The polysilicon layer may have a thickness of about 10 Å to about 100 Å.

A height of each protrusion may be about two times or less of the thickness of the polysilicon layer.

A height of each protrusion is smaller than a thickness of the second flexible layer.

The flexible substrate may further include a barrier layer between the polysilicon layer and the first flexible layer.

The barrier layer may be formed of silicon oxide or silicon nitride.

The flexible substrate may further include a barrier layer on the second flexible layer, the second flexible layer being between the barrier layer and the polysilicon layer.

The first flexible layer and the second flexible layer may be formed of polyimide.

The embodiments may also be realized by providing an organic light emitting diode display including the flexible substrate according to an embodiment; a thin film transistor array on the flexible substrate; an organic light emitting diode connected to the thin film transistor array; and an encapsulation member on the organic light emitting diode.

The embodiments may also be realized by providing a method of manufacturing a flexible substrate, the method including forming a first flexible layer on a support substrate; forming an amorphous silicon layer on the first flexible layer; crystallizing the amorphous silicon layer to form a polysilicon layer having a plurality of protrusions on a surface thereof; and forming a second flexible layer on the polysilicon layer.

The first flexible layer and the second flexible layer may be formed by a solution process.

The crystallization may be performed by an excimer laser annealing method or a sequential lateral solidification method.

The crystallization may be performed by the excimer laser annealing method such that the plurality of protrusions are irregularly disposed on the polysilicon layer.

The crystallization may be performed by the sequential lateral solidification method such that the plurality of protrusions are regularly arranged.

The amorphous silicon layer may be formed to have a thickness of about 10 Å to about 100 Å.

The amorphous silicon layer may be formed by a CVD method.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
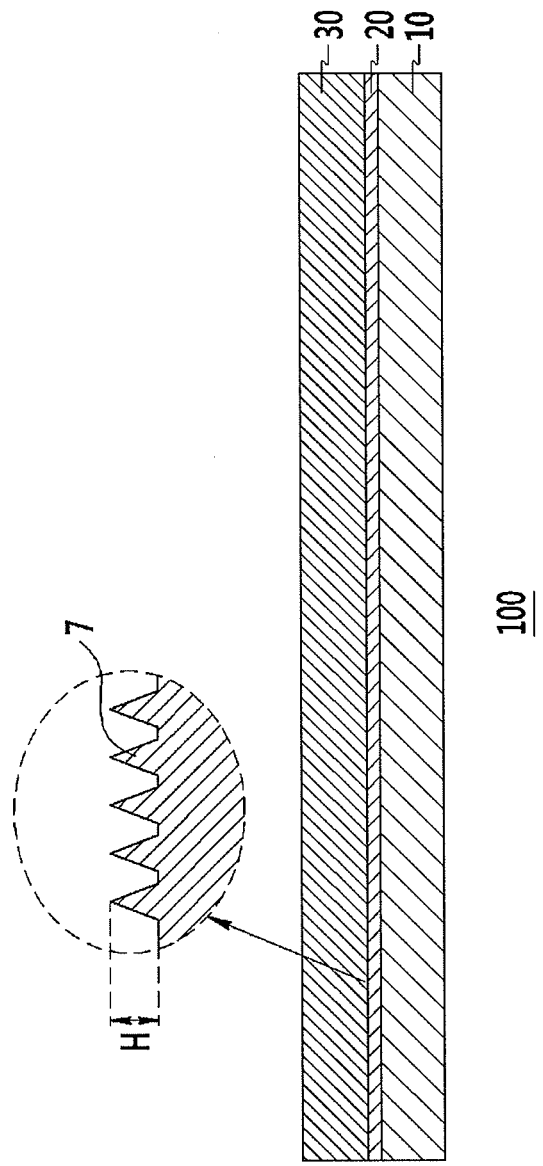
FIG. 1 illustrates a schematic cross-sectional view of a flexible substrate according to an exemplary embodiment.

The embodiments will be described more fully hereinafter with reference to the accompanying drawings, in which exemplary embodiments are shown. As those skilled in the art would realize, the described embodiments may be modified in various different ways, all without departing from the spirit or scope of the embodiments.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a flexible substrate according to an exemplary embodiment will be specifically described with reference to the drawings.

Figure 2:
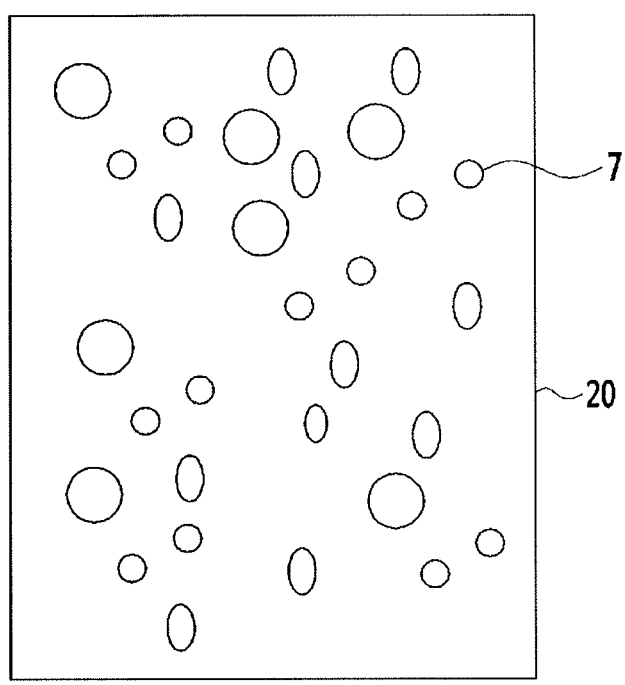
FIGS. 2 to 4 illustrate a schematic top plan view of a protrusion according to the exemplary embodiment.
Figure 3:
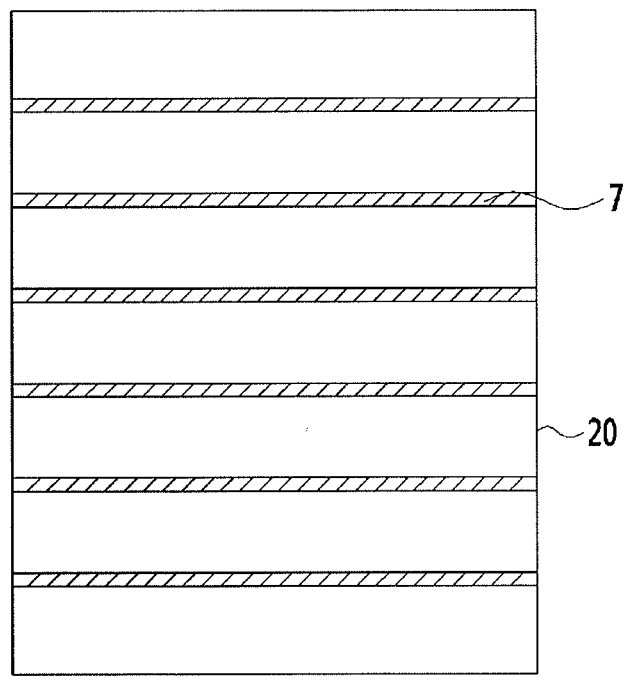
Figure 4:
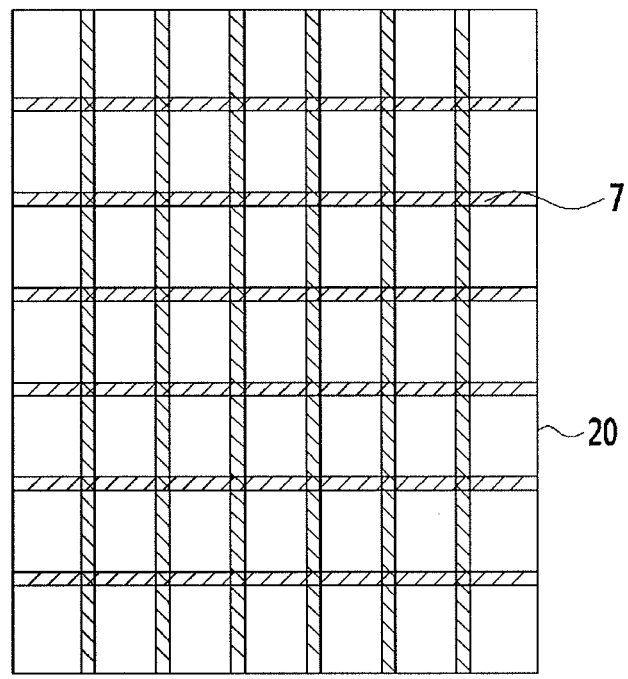

FIG. 1 illustrates a schematic cross-sectional view of a flexible substrate according to an exemplary embodiment, and FIGS. 2 to 4 illustrate a schematic top plan view of a protrusion according to the exemplary embodiment.

As illustrated in FIG. 1, a flexible substrate 100 according to an exemplary embodiment may include a first flexible layer 10, a polysilicon layer 20 on the first flexible layer 10, and a second flexible layer 30 on the polysilicon layer 20.

The first flexible layer 10 and the second flexible layer 30 may be formed of polyimide. Each of the first flexible layer 10 and the second flexible layer 20 may have a thickness within about 10 μm, e.g., up to about 10 μm.

Protrusions 7 may be formed on a surface of the polysilicon layer 20. In an implementation, the protrusions 7 may have an irregular size on the surface of the polysilicon layer. As illustrated in FIG. 2, the protrusions 7 may be irregularly disposed. In an implementation, the protrusions 7 may be regularly arranged in a predetermined form. For example, as illustrated in FIGS. 3 and 4, linear protrusions may be arranged at a regular interval or may form a lattice.

A height (H) of the protrusion 7 may be about two times or less of a thickness of the polysilicon layer 20. For example, the height H of the protrusions (which are a part of the polysilicon layer 20) may be about two times of less of a thickness of a portion of the polysilicon layer 20 that does not include the protrusions 7 thereon, such as a thickness of a portion in valleys between peaks of the protrusions. In an implementation, the height H of the protrusions 7 may be smaller than the thickness of the second flexible layer 30.

Hereinafter, a method of manufacturing the flexible substrate of FIG. 1 will be specifically described.

Figure 5:
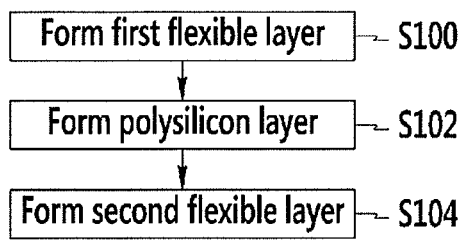
FIG. 5 illustrates a flowchart of a method of manufacturing a flexible substrate according to an embodiment.
Figure 6:
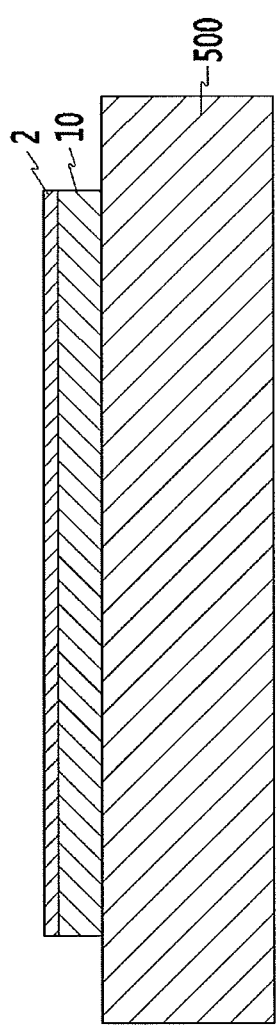
FIGS. 6 and 7 illustrate cross-sectional views sequentially showing a process of manufacturing the flexible substrate according to the exemplary embodiment.
Figure 7:
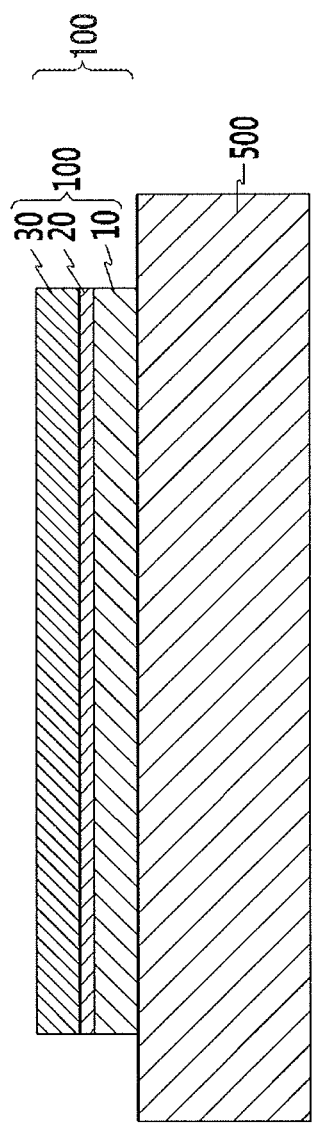

FIG. 5 illustrates a flowchart of a method of manufacturing a flexible substrate according to an embodiment, and FIGS. 6 and 7 illustrate cross-sectional views sequentially showing a process of manufacturing the flexible substrate according to the exemplary embodiment.

As illustrated in FIG. 5, the method may include a step of forming a first flexible layer (S100), a step of forming a polysilicon layer on the first flexible layer (S102), and a step of forming a second flexible layer on the polysilicon layer (S104).

First, as illustrated in FIGS. 5 and 6, the first flexible layer 10 may be formed on a support substrate 500 (S100).

The first flexible layer 10 may be formed by applying a polymer material, e.g., PET, PEN, polysulfone, polycarbonate, polybeneimidazole, and/or polyimide, in a solution form and then performing a curing step. The first flexible layer 10 may be formed to have a thickness of about 10 μm or less.

Next, an amorphous silicon layer 2 may be formed on the first flexible layer 10. The amorphous silicon layer 2 may be formed by being deposited by a chemical vapor deposition method, or the like. The amorphous silicon layer 2 may be formed to have a thickness of about 10 Å to about 100 Å.

Next, as illustrated in FIGS. 5 and 7, a polysilicon layer 20 may be formed by crystallizing the amorphous silicon layer.

Crystallization may be performed by using a crystallization method using a laser, e.g., excimer laser annealing (ELA) or sequential lateral solidification (SLS).

In an excimer laser annealing process, crystallization may be performed while scanning the laser along the amorphous silicon layer 2, and the amorphous silicon layer 2 may be melted by the laser and then form crystals. In this case, protrusions 7 may be formed on a surface of the polysilicon layer 20, and may be irregularly arranged while having an irregular size.

In the sequential lateral solidification, after a mask is disposed, the amorphous silicon layer may be melted by using the laser and then crystallized, and the protrusions 7 may be formed at a boundary of the mask. Accordingly, the protrusions 7 may have a linear or polygon form as illustrated in FIG. 4, according to a form and disposal of the mask.

Figure 11:
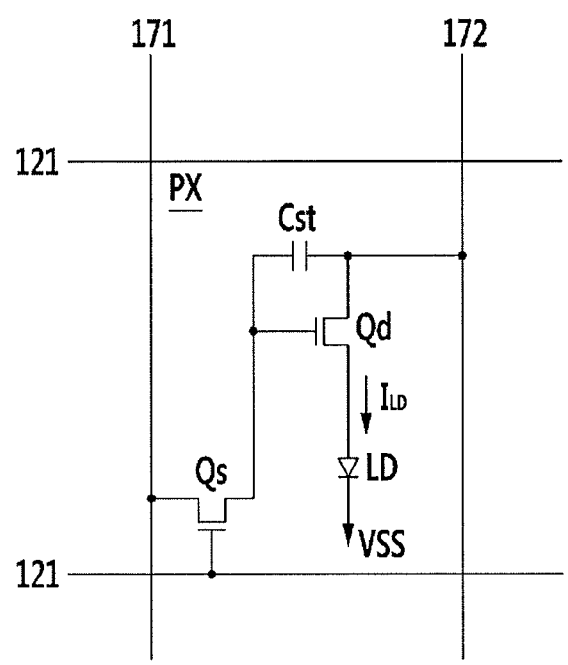
FIG. 11 illustrates an equivalent circuit view of one pixel of an organic light emitting diode display according to the exemplary embodiment.
Figure 12:
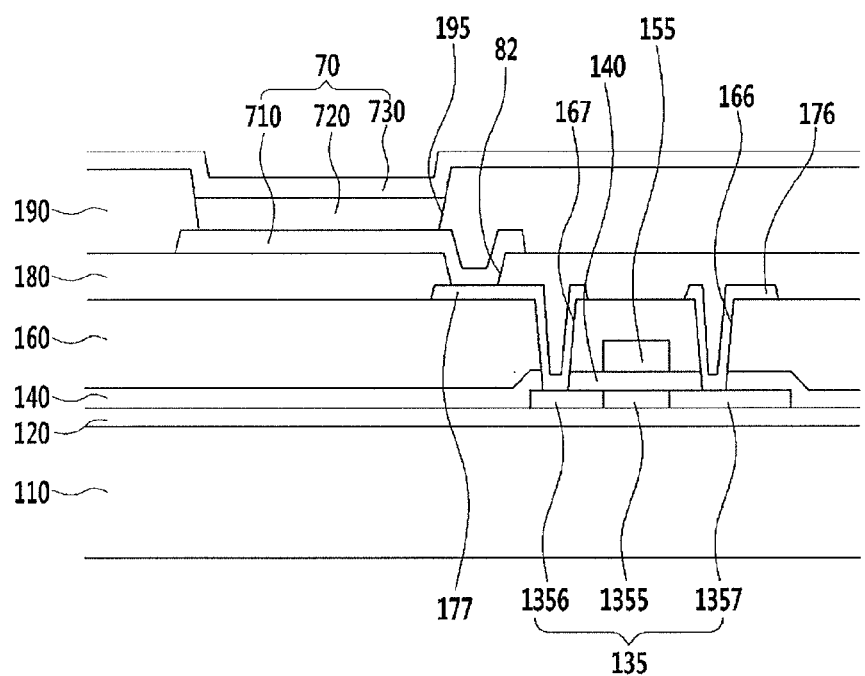
FIG. 12 illustrates a cross-sectional view of the organic light emitting diode display according to the exemplary embodiment.

Thereafter, after a second flexible layer 30 may be formed on the polysilicon layer 20, and the support substrate 500 may be removed to prepare a flexible substrate 100. As illustrated in FIGS. 11 and 12, when the organic light emitting diode display is manufactured, after all of a thin film transistor, a light emitting diode, and an encapsulation member are formed on the flexible substrate 100, the support substrate 500 may be removed.

The second flexible layer 30 may be formed of a same material and by a same method as the first flexible layer 10.

In the exemplary embodiment, a close contacting property between the second flexible layer 30 and the polysilicon layer 20 may be improved by forming the protrusions 7 on the surface of the polysilicon layer 20, on which the second flexible layer 30 is formed, to increase a surface roughness of the polysilicon layer 20. In other words, as will be apparent to a person of ordinary skill in the art from the foregoing description and from the drawings, the protrusions 7 of the polysilicon layer 20 may be formed on a surface of the polysilicon layer 20 that faces the second flexible layer 30, and may extend into the second flexible layer 30 (as shown in the inset of FIG. 1).

Figure 8:
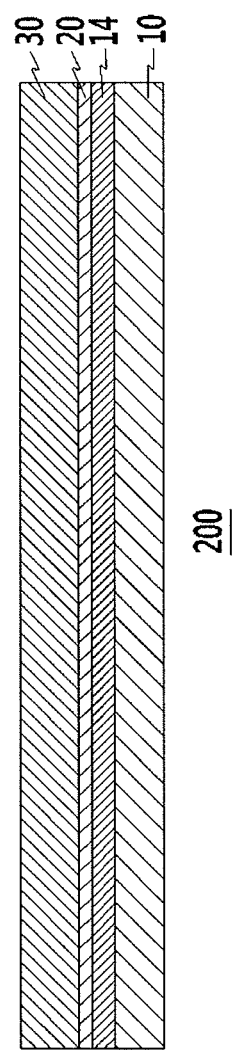
FIGS. 8 to 10 illustrate cross-sectional views of a flexible substrate according to another exemplary embodiment.
Figure 9:
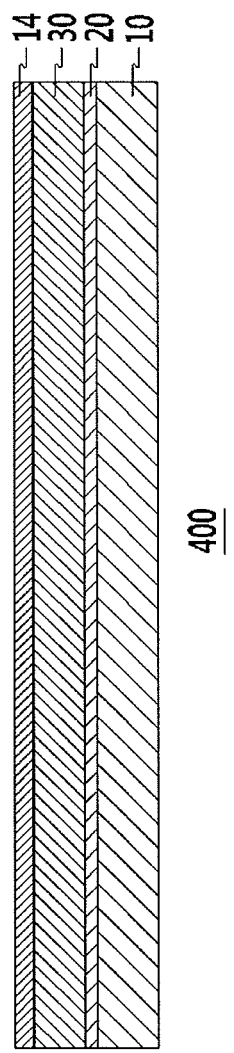
Figure 10:
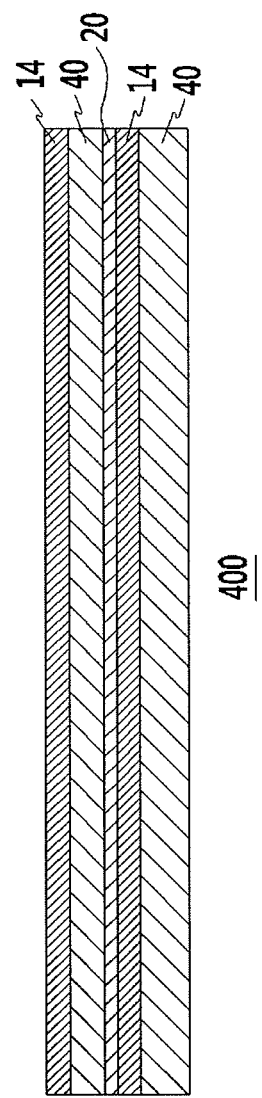

FIGS. 8 to 10 illustrate cross-sectional views of a flexible substrate according to another exemplary embodiment.

As illustrated in FIG. 8, a flexible substrate 200 according to the exemplary embodiment may include a first flexible layer 10, a barrier layer 14 on the first flexible layer 10, a polysilicon layer 20 on the barrier layer 14, and a second flexible layer 30 on the polysilicon layer 20. For example, the barrier layer 14 may be between the first flexible layer 10 and the polysilicon layer 20.

The barrier layer 14 may help prevent transmission of moisture from the outside, may be formed of silicon oxide or silicon nitride, and may be a single layer or a plurality of layers.

In an implementation, the barrier layer 14 may be formed on the second flexible layer 30, as in the flexible substrate 300 of FIG. 9. In an implementation, the barrier layer 14 and a flexible layer 40 may be repeatedly laminated like in the flexible substrate 400 of FIG. 10. For example, the barrier layer 14 and a flexible layer 40 may be repeatedly and alternately stacked, with the polysilicon layer 20 between the repeated stacks.

Hereinafter, an organic light emitting diode display including the flexible substrate of FIGS. 1 to 10 will be specifically described.

FIG. 11 illustrates an equivalent circuit view of one pixel of an organic light emitting diode display according to the exemplary embodiment.

As illustrated in FIG. 11, the organic light emitting diode display according to the exemplary embodiment may include a plurality of signal lines 121, 171, and 172 and a plurality of pixels (PX) connected thereto and arranged in an approximate matrix form.

The signal lines may include a plurality of gate lines 121 transferring a gate signal (or a scan signal), a plurality of data lines 171 transferring a data signal, and a plurality of driving voltage lines 172 transferring a driving voltage (Vdd). The gate lines 121 may extend in an approximate row direction and may be almost parallel to each other, and vertical direction portions of the data line 171 and the driving voltage line 172 may extend in an approximate column direction and may be almost parallel to each other.

Each pixel PX may include a switching thin film transistor (Qs), a driving thin film transistor (Qd), a storage capacitor (Cst), and an organic light emitting diode (OLED) (LD).

The switching thin film transistor (Qs) may have a control terminal, an input terminal, and an output terminal, the control terminal may be connected to the gate line 121, the input terminal may be connected to the data line 171, and the output terminal may be connected to the driving thin film transistor (Qd). The switching thin film transistor (Qs) may respond to the scan signal applied to the gate line 121 to transfer the data signal applied to the data line 171 to the driving thin film transistor (Qd).

Further, the driving thin film transistor (Qd) may have the control terminal, the input terminal, and the output terminal, and the control terminal may be connected to the switching thin film transistor (Qs), the input terminal may be connected to the driving voltage line 172, and the output terminal may be connected to the organic light emitting diode (LD). The driving thin film transistor (Qd) may allow an output current (ILD) having a magnitude varying according to a voltage applied between the control terminal and the output terminal to flow.

The capacitor (Cst) may be connected between the control terminal and the input terminal of the driving thin film transistor (Qd). This capacitor (Cst) may charge the data signal applied to the control terminal of the driving thin film transistor (Qd) and may maintain the data signal after the switching thin film transistor (Qs) is turned off.

The organic light emitting diode (LD) may have an anode connected to the output terminal of the driving thin film transistor (Qd), and a cathode connected to a common voltage (Vss). The organic light emitting diode (LD) may display an image by emitting light while changing the intensity thereof according to the output current (ILD) of the driving thin film transistor (Qd).

Further, the connection relationship of the thin film transistors (Qs, Qd), the capacitor (Cst), and the organic light emitting diode (LD) may be changed.

FIG. 12 illustrates a cross-sectional view of the organic light emitting diode display according to the exemplary embodiment.

Since interlayer constitutions of the switching transistor and the driving thin film transistor of the organic light emitting diode display according to one exemplary embodiment are similar to each other, the driving transistor will be mainly described.

The organic light emitting diode display according to the exemplary embodiment may include a substrate 110, a buffer layer 120 on the substrate 110, and a semiconductor 135 on the buffer layer 120.

The substrate 110 may be a flexible substrate, and may be a flexible substrate of FIGS. 1 to 10, e.g., according to an embodiment.

The buffer layer 120 may be formed on the substrate 110, and when the substrate is formed of the flexible substrate of FIG. 10, the buffer layer 120 may be a barrier layer 14 of FIG. 10.

Accordingly, the barrier layer 120 may be formed to have a single layer of silicon nitride ($SiN_x$) or a plurality of layers where silicon nitride ($SiN_x$) and silicon oxide ($SiO_2$) are laminated. The barrier layer 120 may help prevent unnecessary or undesirable components such as an impurity or moisture from permeating and may planarize the surface.

A semiconductor 135 formed of polysilicon may be formed on the buffer layer 120. The semiconductor 135 may have a thickness of about 450 Å or more.

The semiconductor 135 may be divided into a channel region 1355, and a source region 1356 and a drain region 1357 formed at both sides of the channel region 1355. The channel region 1355 of the semiconductor 135 may be polysilicon not doped with the impurity, e.g., an intrinsic semiconductor. The source region 1356 and the drain region 1357 of the semiconductor 135 may be polysilicon doped with a conductive impurity, e.g., an impurity semiconductor.

The impurity doped on the source region 1356 and the drain region 1357 may include any one of a p-type impurity and an n-type impurity.

A gate insulating layer 140 may be formed on the semiconductor 135.

The gate insulating layer 140 may be a single layer or a plurality of layers including at least one of tetraethoxysilane (tetraethyl orthosilicate, TEOS), silicon nitride, and silicon oxide.

A gate electrode 155 may be formed on the gate insulating layer 140.

The gate electrode 155 may be formed of a single layer or a plurality of layers of a low resistance material, e.g., Al, Ti, Mo, Cu, Ni, or an alloy thereof, or a material having strong corrosion resistance. For example, the gate electrode may be a triple layer of Ti/Cu/Ti, Ti/Ag/Ti, or Mo/Al/Mo.

A first interlayer insulating layer 160 may be formed on the gate line 155.

The first interlayer insulating layer 160 may be formed of a single layer or a plurality of layers of tetraethoxysilane (tetraethyl orthosilicate, TEOS), silicon nitride, or silicon oxide, like the gate insulating layer 140.

A source electrode 176 and a drain electrode 177 may be formed on the first interlayer insulating layer 160, and the source electrode 176 and the drain electrode 177 may be connected through contact holes 166 and 167 to the source region 1356 and the drain region 1357, respectively.

The source electrode 176 and the drain electrode 177 may be formed of a single layer or a plurality of layers of a low resistance material, e.g., Al, Ti, Mo, Cu, Ni, or an alloy thereof, or a material having strong corrosion resistance. For example, the source electrode and the drain electrode may be a triple layer of Ti/Cu/Ti, Ti/Ag/Ti, or Mo/Al/Mo.

The gate electrode 155, the source electrode 176, and the drain electrode 177 may each form a thin film transistor (TFT) together with the semiconductor 135. Channels of the thin film transistor may each be formed in the semiconductor 135 between the source electrode 176 and the drain electrode 177.

A second interlayer insulating layer 180 may be formed on the source electrode 176 and the drain electrode 177.

The second interlayer insulating layer 180 may be formed of a single layer or a plurality of layers of tetraethoxysilane (tetraethyl orthosilicate, TEOS), silicon nitride, or silicon oxide like the first interlayer insulating layer.

A first electrode 710 may be formed on the second interlayer insulating layer 180. The first electrode 710 may be an anode of the organic light emitting diode of FIG. 11.

A pixel defining layer 190 (having an opening 195 through which the first electrode 710 is exposed) may be formed on the second interlayer insulating layer 180.

The pixel defining layer 190 may have the opening 195 through which the first electrode 710 is exposed. The pixel defining film 190 may include a resin, e.g., polyacrylates or polyimides, silica-based inorganic materials, or the like.

An organic emission layer 720 may be formed on the first electrode 710 in the opening 195.

The organic emission layer 720 may be formed of a plurality of layers including one or more of an emission layer, a hole injection layer (HIL), a hole transport layer (HTL), an electron transport layer (ETL), and an electron injection layer (EIL).

In the case where the organic emission layer 720 includes all of the above-described layers, the hole injection layer (HIL) may be disposed on the first electrode 710 that is the anode, and the hole transport layer (HTL), the emission layer, the electron transport layer (ETL), and the electron injection layer (EIL) may be sequentially laminated thereon.

A second electrode 730 may be formed on the organic emission layer 720 and the pixel defining layer 190. The second electrode 730 may be a cathode of the organic light emitting diode of FIG. 11.

The first electrode 710, the organic emission layer 720, and the second electrode 730 may form an organic light emitting diode 70.

The organic light emitting diode display may have a structure of a front surface display type, a rear surface display type, and a double-sided display type, according to a direction of light emitted by the organic light emitting diode 70.

In the front surface display type, the first electrode 710 may be formed of a reflective layer, and the second electrode 730 may be formed of a semi-transmission layer or a transmission layer. In the case of the rear surface display type, the first electrode 710 may be formed of the semi-transmission layer, and the second electrode 730 may be formed of the reflective layer. In addition, in the case of the double-sided display type, the first electrode 710 and the second electrode 730 may both be formed of a transparent layer or the semi-transmission layer.

The reflective layer and the semi-transmission layer may be made by using one or more metals of magnesium (Mg), silver (Ag), gold (Au), calcium (Ca), lithium (Li), chromium (Cr), and aluminum (Al), or an alloy thereof. The reflective layer and the semi-transmission layer may be determined by the thickness, and the semi-transmission layer may be formed to have a thickness of about 200 nm or less. Transmittance of light may be increased as the thickness is reduced, but if the thickness is very small, resistance may be increased.

The transparent layer may be formed of a material such as ITO (indium tin oxide), IZO (indium zinc oxide), ZnO (zinc oxide), or $In_2O_3$ (indium oxide).

An encapsulation member (not illustrated) may be formed on the second electrode 730. The encapsulation member may be an inorganic layer or an organic layer, and may be alternately laminated. The encapsulation member may protect a pixel from the external air.

One or more organic layers and one or more inorganic layers may be alternately laminated. The inorganic layer or the organic layer may be each provided in plural.

The organic layer may be formed of a polymer. For example, the organic layer may be a single layer or a laminated layer formed of any one of polyethylene terephthalate, polyimide, polycarbonate, epoxy, polyethylene, and polyacrylate. In an implementation, the organic layer may be formed of polyacrylate, and specifically, includes a matter where a monomer composition including a diacrylate-based monomer and a triacrylate-based monomer is polymerized. A monoacrylate-based monomer may be further included in the monomer composition. Further, a suitable photoinitiator such as TPO may be further included in the monomer composition, but is not limited thereto.

The inorganic layer may be a single layer or a laminated layer including metal oxide or metal nitride. For example, the inorganic layer may include any one of $SiN_x$, $Al_2O_3$, $SiO_2$, and $TiO_2$.

The uppermost layer, which is exposed to the outside, of the encapsulation member may be formed of the inorganic layer in order to help prevent permeation of moisture to the organic light emitting diode.

The encapsulation member may include at least one sandwich structure in which at least one organic layer is inserted between at least two inorganic layers. Further, the encapsulation member may include at least one sandwich structure in which at least one inorganic layer is inserted between at least two organic layers.

A halogenated metal layer (including, e.g., LiF) may be further included between the second electrode 730 and the inorganic layer. The halogenated metal layer may help prevent a display portion including the second electrode 730 from being damaged when the inorganic layer is formed by a sputtering manner or a plasma deposition manner.

The encapsulation member may be replaced by an encapsulation substrate such as a metal substrate or a glass substrate, instead of forming the organic layer and the inorganic layer.

By way of summation and review, in an organic light emitting diode display market, a flexible display device manufactured so as to be bendable by using a substrate of a flexible material that easily has a large area and is capable of being reduced in thickness and weight, such as plastic or foil, has been considered.

The flexible substrate may have a single layer or a plurality of layers. However, the flexible substrate may be exposed to repeated bending, due to a characteristic thereof. Thus, a rift may be formed between the flexible substrates formed of a plurality of layers due to the repeated bending.

The embodiments provide a flexible substrate, a method of manufacturing the same, and an organic light emitting diode display, in which a rift is not generated between flexible substrates formed of a plurality of layers due to repeated bending.

Manufacturing a flexible substrate according to an embodiment may help ensure that even though the flexible substrates formed of a plurality of layers are repeatedly bent, a rift may not be formed between the flexible substrates. Accordingly, it is possible to provide a high-quality organic light emitting diode display.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
   a flexible substrate;
   a thin film transistor on the flexible substrate with a buffer layer spacing the thin film transistor apart from the flexible substrate;
   an organic light emitting diode connected to the thin film transistor; and
   an encapsulation member on the organic light emitting diode,
   wherein the flexible substrate includes:
      a first flexible layer;
      a polysilicon layer on the first flexible layer, the polysilicon layer having a plurality of protrusions on a surface thereof; and
      a second flexible layer directly on the polysilicon layer.

2. The organic light emitting diode display as claimed in claim 1, wherein the protrusions are irregularly disposed on the polysilicon layer.

3. The organic light emitting diode display as claimed in claim 1, wherein the plurality of protrusions are regularly arranged.

4. The organic light emitting diode display as claimed in claim 3, wherein the plurality of protrusions have a linear shape or a polygonal shape.

5. The organic light emitting diode display as claimed in claim 1, wherein the polysilicon layer has a thickness of about 10 Å to about 100 Å.

6. The organic light emitting diode display as claimed in claim 5, wherein a height of each protrusion is about two times or less of the thickness of the polysilicon layer.

7. The organic light emitting diode display as claimed in claim 1, wherein a height of each protrusion is smaller than a thickness of the second flexible layer.

8. The organic light emitting diode display as claimed in claim 1, further comprising a barrier layer between the polysilicon layer and the first flexible layer.

9. The organic light emitting diode display as claimed in claim 8, wherein the barrier layer is formed of silicon oxide or silicon nitride.

10. The The organic light emitting diode display as claimed in claim 1, further comprising a barrier layer on the second flexible layer, the second flexible layer being between the barrier layer and the polysilicon layer.

11. The organic light emitting diode display as claimed in claim 1, wherein the first flexible layer and the second flexible layer are formed of polyimide.

12. The organic light emitting diode display as claimed in claim 1, wherein the protrusions extend into the second flexible layer.

* * * * *